(12) United States Patent
Imangholi et al.

(10) Patent No.: US 9,164,001 B2
(45) Date of Patent: Oct. 20, 2015

(54) USING AN LED DIE TO MEASURE TEMPERATURE INSIDE SILICONE THAT ENCAPSULATES AN LED ARRAY

(71) Applicant: Bridgelux, Inc., Livermore, CA (US)

(72) Inventors: Babak Imangholi, Livermore, CA (US); Michael Neal Gershowitz, San Jose, CA (US); R. Scott West, Pleasanton, CA (US)

(73) Assignee: Bridgelux, Inc., Livermore, CA (US)

( * ) Notice: Subject to any disclaimer, the term of this patent is extended or adjusted under 35 U.S.C. 154(b) by 55 days.

(21) Appl. No.: 13/930,672

(22) Filed: Jun. 28, 2013

(65) Prior Publication Data

US 2015/0002023 A1 Jan. 1, 2015

(51) Int. Cl.
*H05B 37/02* (2006.01)
*G01K 7/00* (2006.01)
*H05B 33/08* (2006.01)

(52) U.S. Cl.
CPC .............. *G01K 7/00* (2013.01); *H05B 33/0851* (2013.01); *H05B 37/02* (2013.01)

(58) Field of Classification Search
USPC .............. 315/113, 117, 185 R, 294, 307, 309
See application file for complete search history.

(56) References Cited

U.S. PATENT DOCUMENTS

| | | | |
|---|---|---|---|
| 8,274,644 B2 | 9/2012 | Nisper et al. | 356/45 |
| 8,371,717 B2 | 2/2013 | Lai | 362/276 |
| 8,629,619 B2 * | 1/2014 | Clauberg | H05B 33/0815 315/119 |
| 2004/0121502 A1 * | 6/2004 | Summers et al. | 438/47 |
| 2007/0041185 A1 * | 2/2007 | Yatsuda et al. | 362/231 |
| 2009/0024349 A1 * | 1/2009 | Boerstler et al. | 702/132 |
| 2011/0199203 A1 | 8/2011 | Hsu | 340/449 |
| 2012/0032612 A1 | 2/2012 | Antony et al. | 315/297 |
| 2012/0062150 A1 | 3/2012 | West | 315/309 |
| 2012/0256548 A1 | 10/2012 | Collins et al. | 315/151 |
| 2012/0306370 A1 * | 12/2012 | Van De Ven et al. | 315/113 |
| 2013/0207548 A1 * | 8/2013 | Leshniak | H05B 33/0803 315/121 |

OTHER PUBLICATIONS

Xi et al., "Junction-temperature measurement in GaN ultraviolet light-emitting diodes using diode forward voltage method," Applied Physics Letters, vol. 85, No. 12 (Sep. 20, 2004) pp. 2163-2165 (3 pages).

* cited by examiner

*Primary Examiner* — Tung X Le
(74) *Attorney, Agent, or Firm* — Imperium Patent Works; Darien K. Wallace

(57) ABSTRACT

A light-emitting diode (LED) device includes first and second LED dies with the same structure and that are both encapsulated by the same silicone layer. The first LED is supplied with sufficient drive current to illuminate the LED. Control circuitry supplies the second LED with a constant current, determines the voltage across the second LED, and calculates the temperature of the second LED based on the voltage across the second LED. The constant current has a maximum magnitude that never exceeds the maximum magnitude of the drive current. The LED device is able to calculate the temperature of a diode with a gallium-nitride layer (GaN or GaInN) that is receiving a large drive current and emitting blue light by determining the voltage across an adjacent similar diode with a gallium-nitride layer through which a small constant current is flowing. Preferably, the band gap of the LEDs exceeds two electron volts.

12 Claims, 6 Drawing Sheets

VOLTAGE ACROSS GaN DIODE WITH
CONSTANT 5mA CURRENT THROUGH DIODE

CURRENT THROUGH GaN DIODE WHILE
CONSTANT 2.6V IS MAINTAINED ACROSS DIODE

USING AN LED DIE TO MEASURE TEMPERATURE INSIDE SILICONE THAT ENCAPSULATES AN LED ARRAY

TECHNICAL FIELD

The present invention relates generally to packaging for light-emitting diodes, and more particularly, to a method of determining the temperature inside a silicone layer that encapsulates an array of LED dies.

BACKGROUND INFORMATION

Light emitting diodes (LEDs) are an important class of solid-state devices that convert electric energy into light. Improvements in these devices have resulted in their use as light sources replacing conventional incandescent and fluorescent light fixtures. The energy conversion efficiency of LEDs now approaches the level attained by fluorescent light fixtures and promises to exceed even these efficiencies. Moreover, LEDs have significantly longer lifetimes than both incandescent bulbs and fluorescent tubes. However, the useful lifetime of LEDs is significantly reduced if the operating temperature exceeds certain limits.

The operating environment of an LED light source is typically hot, and overheating must be controlled in order to extend the operating life of the light source. The high operating temperatures of commercial white LED light sources result primarily from two factors. First, the phosphor that converts blue light from the LED dies into longer wavelength light generates heat. Thin layers of Group III nitrides, such as gallium nitrides (GaN or gallium indium nitride GaInN), are used to produce LEDs for general commercial lighting applications. For example, thin epitaxial layers of gallium nitrides are grown on sapphire substrates ($Al_2O_3$). Light is emitted from the epitaxial layers sandwiched between oppositely doped layers when a voltage is applied across the doped layers. Gallium-nitride LED dies (GaN or GaInN) emit blue light having a wavelength in a range from 430 nanometers to 460 nanometers. A phosphor coating then absorbs some of the emitted blue light and fluoresces to emit light with longer wavelengths so that the overall LED device emits light with a wider range of wavelengths, which is perceived as "white" light by a human observer. The phosphor does not convert all of the blue light to longer wavelength light, but rather converts much of the blue light to heat.

Second, a single LED die produces too little light to be used as a replacement for a conventional light source in most applications. Hence, a replacement light source must include a large number of individual LED dies. The large number of LED dies that are packaged in close proximity to one another under a transparent carrier material that contains phosphor particles results in a large amount of heat generated within a small volume. The temperature under the transparent carrier material rises when the large amount of heat generated by the many LED dies cannot be conducted fast enough away from the LED device due to inadequate heat conduction of the luminaire housing, which may be exacerbated in a hot environment.

Although LED package designs include heat carriers and heat sinks that conduct heat away from the LED device, it is nevertheless advantageous to determine the temperature of the LED device in order to take corrective measures if heat is not dissipated sufficiently to maintain the temperature of the LED device below a critical level. A conventional way to determine the temperature of the LED device is to place a thermistor or thermocouple on the LED package near the LED device. However, this method does not measure the temperature directly at the LED dies covered by the transparent carrier material. Depending on how the heat propagates away from the LED dies, the temperature at the thermistor does not reflect the actual temperature under the transparent carrier material. Moreover, this manner of measuring temperature provides a relatively slow feedback and can lead to oscillation in the temperature control. Because the source of the heat is the LED dies and the phosphor particles under the transparent carrier material, the temperature at the thermistor or thermocouple outside the transparent carrier material is indicative of the heat that was produced earlier within the transparent carrier material. By the time the thermistor or thermocouple measures a temperature that exceeds a threshold and LED drive current is reduced in order to reduce the heat generated by the LED device, the temperature within the transparent carrier material may already have fallen because the temperature measured at the thermistor or thermocouple resulted from earlier produced heat that later reached the thermistor or thermocouple. The delayed feedback will cause the current control to overcompensate both after the measured temperature exceeds an upper threshold and after the measured temperature falls below a lower threshold. An oscillating LED device temperature results.

Thermistors and thermocouples are typically not placed near the LED dies under the transparent carrier material, however, because they absorb light and would result in a non-uniform pattern of light generation from the LED device. Moreover, placing a thermistor or thermocouple within the LED array would add an additional manufacturing step and would require additional machinery. So the cost of the resulting LED device would increase significantly. A inexpensive method is sought for determining the temperature of LED dies covered by a transparent carrier material that includes phosphor without causing the light emitted from the LED device to be non-uniform.

SUMMARY

A light-emitting diode (LED) device includes first and second LED dies that both have the same structure and that are both encapsulated by a silicone layer. Driver circuitry supplies the first LED die with sufficient drive current to illuminate the first LED die. Control circuitry supplies the second LED die with a constant current, determines the voltage across the second LED die, and calculates the temperature of the second LED die based on the voltage across the second LED die. The LED drive current has a maximum magnitude that exceeds ten milliamps, and the constant current that is supplied to the second LED die never exceeds ten milliamps. Thus, the maximum magnitude of the constant current never exceeds the maximum magnitude of the drive current. The LED device is able to calculate the temperature of a diode with a gallium-nitride layer (GaN or GaInN) that is receiving a large drive current and emitting blue light by determining the voltage across an adjacent similar diode with a gallium-nitride layer through which a small constant current is flowing.

A method for determining the temperature of an LED die of an array of LED dies covered by a silicone layer involves determining the voltage drop across a single LED die. Both a first LED die and a second LED die are encapsulated by the same silicone layer in which phosphor particles are suspended. And both the first LED die and the second LED die have the same structure. In one implementation, the band gap of the LED dies exceeds two electron volts. The first LED die is illuminated by supplying a drive current to the first LED die. While the second LED die is being supplied with a small constant bias current, the voltage across the second LED die is determined. The temperature of the second LED die is determined based on the voltage across the second LED die.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
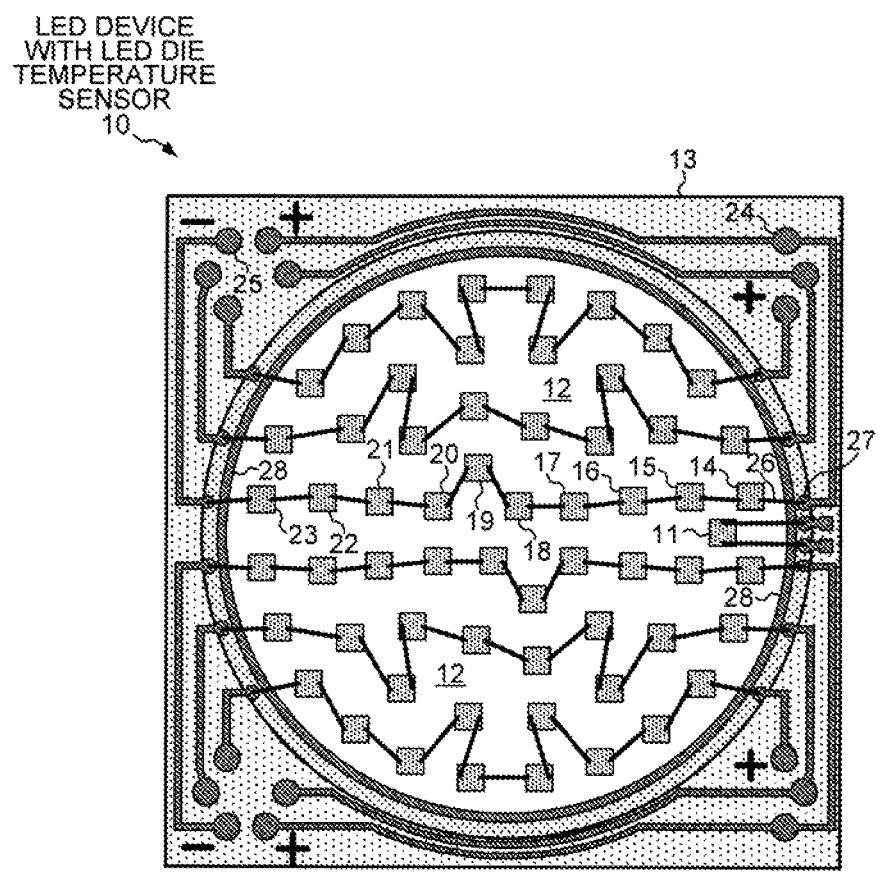
FIG. 1 is a top view of a device with an LED die used to determine the temperature under a silicone layer that covers an array of other LED dies.

FIG. 1 shows a light-emitting diode (LED) device 10 with an LED die 11 used to determine the temperature under a transparent carrier material that includes phosphor and that covers an array of other LED dies. LED device 10 includes an array of sixty-one structurally identical LED dies (chips). Each of the LED dies includes epitaxial layers of GaN or GaInN grown on a sapphire substrate. In other embodiments, the gallium-nitride layer is grown on a substrate of crystalline silicon. Each of the sixty-one LED dies is mounted on an aluminum substrate 12 that is housed in a ceramic package 13. The gallium-nitride LED dies emit blue light with a wavelength of about 452 nanometers when a sufficient drive current is passed through the diodes. For example, a string of ten LED dies 14-23 are connected in series such that a drive current can flow from a positive supply terminal 24 through the LED dies 14-23 to a negative supply terminal 25. The LED dies are connected to each other and to the supply terminals by bond wires 24. For example, a bond wire 26 connects LED die 14 to a landing pad 27 of positive supply terminal 24.

The array of sixty-one LED dies is covered by a transparent carrier material, such as a layer of silicone or epoxy. Particles of phosphor are suspended in the transparent carrier material. The phosphor converts a portion of the blue light generated by the LED dies into light in the yellow region of the optical spectrum. The combination of the blue and yellow light is perceived as "white" light by a human observer. A slurry of phosphor suspended in silicone is dispensed into a ring or dam 28 around the array of LED dies. The silicone layer inside dam 28 forms an optical surface, such as a lens or a structured surface. The blue light from the LED dies and the yellow light from the phosphor particles is more likely to exit the silicone layer if the surface is structured as opposed to smooth because the scattered light is more likely to strike the surface at a normal angle that exhibits a lower total internal reflection (TIR). For example, the structured surface of the silicone layer can have a small sinusoidal wave structures, "rectified" wave structures (hemispheres) or saw-tooth structures.

Drive current is not passed through LED die 11, and LED die 11 is not connected to the power supply terminals or other driver circuitry. Instead, sensor LED die 11 is connected to control circuitry that supplies LED die 11 with a constant current and that determines the voltage across LED die 11. At a constant current flowing through LED die 11, the voltage across LED die 11 depends on the temperature of LED die 11. Because the silicon layer encapsulates LED die 11 as well as the other LED dies and all of the dies are in the same environment, the temperature of LED die 11 is approximately the same as the temperature of the other dies in its vicinity, such as dies 14-15. In fact, the temperature of all of the sixty-one LED dies under the silicone layer is nearly the same and does not vary by more than a few degrees. Certainly, the temperature of LED die 11 is much closer to the temperature of the other LED dies than would be the temperature of a thermistor that is not covered by the silicone layer and that is placed outside dam 19.

Figure 2:
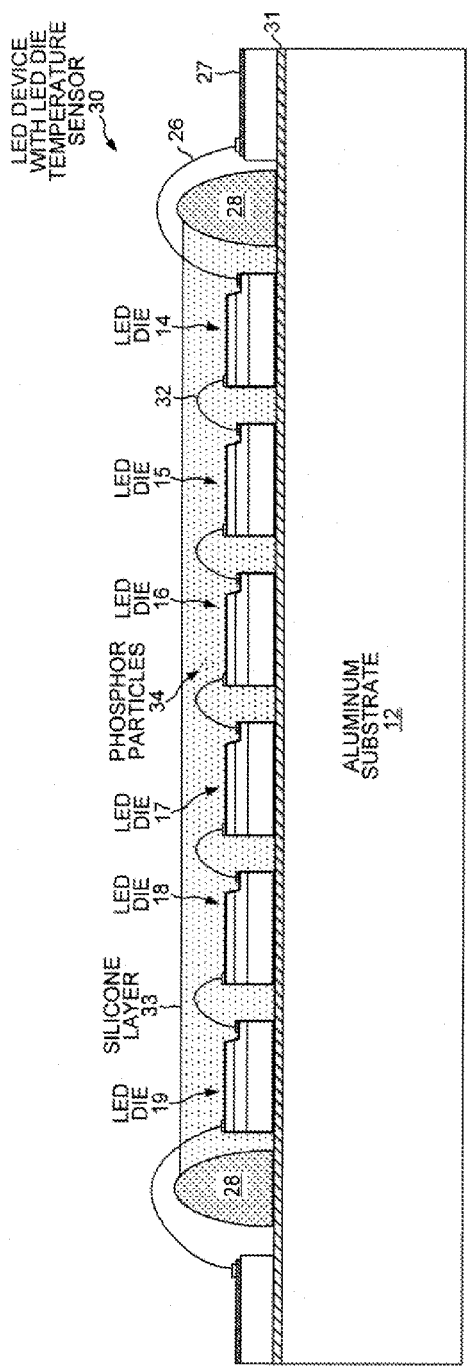
FIG. 2 is a cross-sectional view of a device that uses an LED die to determine the temperature within a silicone layer and roughly corresponds to a cross section of the device of FIG. 1.

FIG. 2 is a cross-sectional view of an LED device 30 that uses LED die 11 to determine the temperature within a silicone layer 31. The cross-sectional view of LED device 30 in FIG. 2 roughly corresponds to the cross section of LED device 10 through the string of LED dies 14-23 in FIG. 1. Sensor LED die 11 and the other LED dies are mounted directly to aluminum substrate 12 in a chip-on-board (COB) manner. The top of aluminum substrate 12 includes various layers of dielectric and metal to form contacts and isolations. In some embodiments, the illuminated LED dies 14-19 are electrically connected to power and driver circuitry, and sensor LED die 11 is electrically connected to control circuitry, through conductive layers at the top of aluminum substrate 12 with bond wires connecting to tap points on the conductive layers. In the embodiment of FIG. 2, however, the illuminated LED dies 14-19 are electrically connected to power through bond wires 26, 32. FIG. 2 shows the silicone layer 33 that contains phosphor particles 34. Silicone or another transparent carrier material is poured into dam 28 and hardens forming a conformal covering over the LED dies. The silicone layer 33 also protects the bond wires 32.

Figure 3:
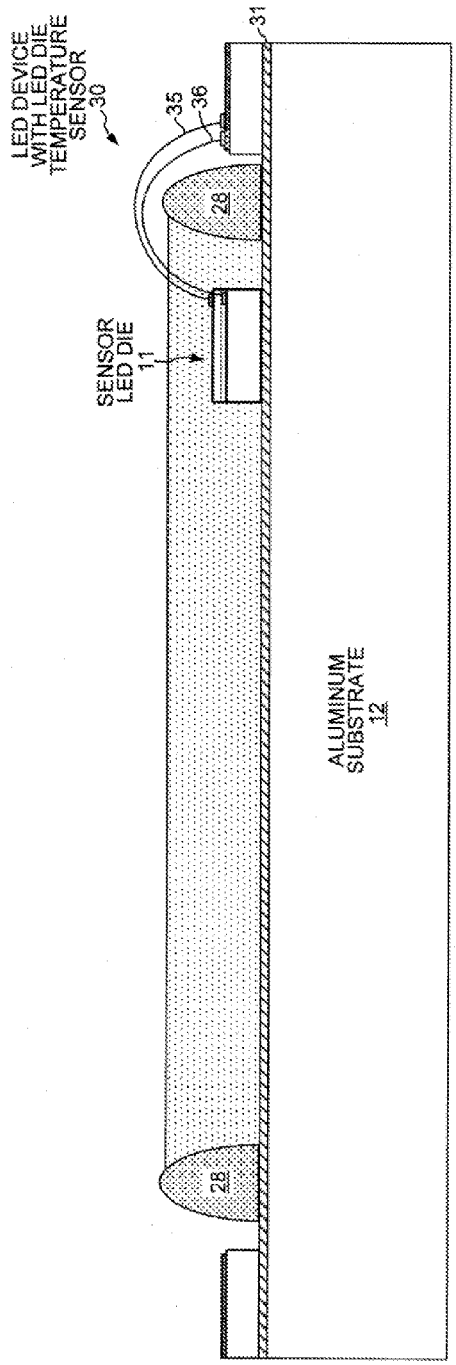
FIG. 3 is another cross-sectional view of a device that uses an LED die to determine the temperature within a silicone layer and roughly corresponds to another cross section of the device of FIG. 1.

FIG. 3 is another cross-sectional view of LED device 30 passing through LED die 11. The cross-sectional view of LED device 30 in FIG. 3 roughly corresponds to the cross section of LED device 10 through LED die 11 in FIG. 1. Sensor LED die 11 is adjacent to illuminated LED dies 14-15 in LED device 30. Whereas the illuminated LED dies 14-19 are connected to driver circuitry and are provided with a drive current, sensor LED die 11 is connected to control circuitry that supplies LED die 11 with a small constant bias current. The maximum magnitude of the constant bias current never exceeds the maximum magnitude of the drive current that illuminates LED dies 14-19. In fact, the constant bias current is very small and never exceeds ten milliamps. In a preferred embodiment, the constant current supplied by the control circuitry to sensor LED die 11 is about one milliamp. However, the constant bias current can even be on the order of microamps. LED die 11 is connected to the control circuitry by bond wires 35-36. The control circuitry determines the voltage across sensor LED die 11 and then determines the temperature of LED die 11 based on that voltage.

Figure 4:
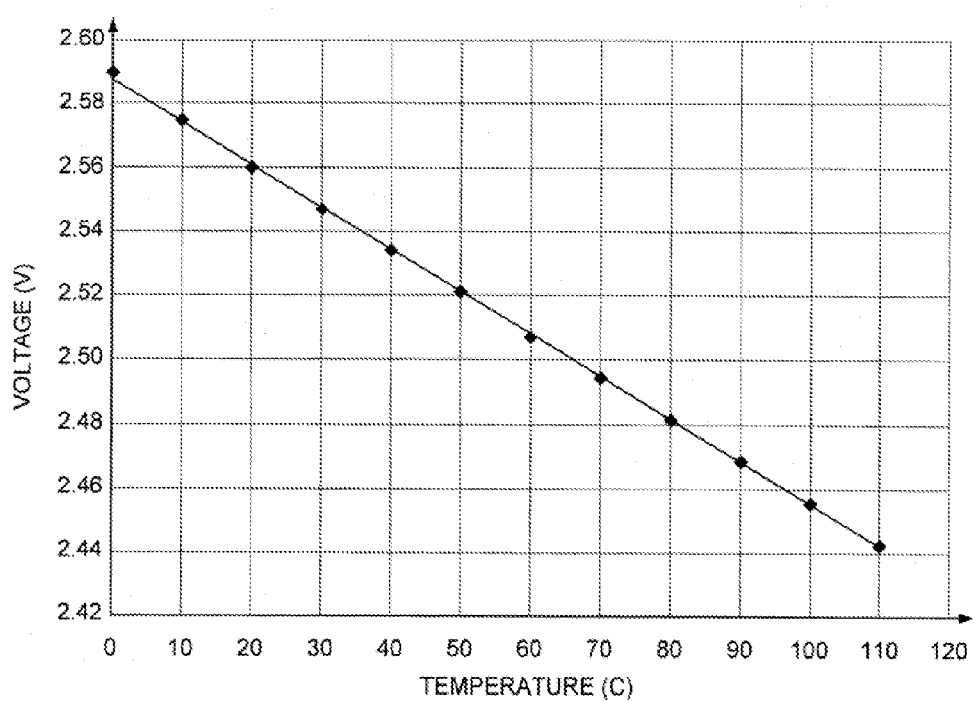
FIG. 4 is a graph of the temperature-voltage relationship of a gallium-nitride diode under a constant current of five milliamps.

FIG. 4 is a graph of the temperature-voltage relationship of a gallium-nitride diode under a constant current of five milliamps. The voltage across gallium-nitride LED die 11 while a constant current is flowing varies linearly with the temperature of LED die 11. The voltage across LED die 11 decreases as the temperature increases while the constant current is flowing. For example, the control circuitry can determine that the temperature of LED die 11 is about 105° C. if the voltage across LED die 11 is 2.45 volts while a constant current of 5 mA is flowing through LED die 11.

Although all of the LED dies under silicone layer 33 are capable of generating light, they are nevertheless diodes and exhibit the standard characteristics of a diode. A diode is created by joining a p-type semiconductor with an n-type semiconductor to form a pn junction. The p-type semiconductor is doped with a trivalent atom such as indium or aluminum. The three valence electrons covalently bond with the semiconducting material and leave a "hole" in the fourth bond. The n-type semiconductor is doped with a donor atom such as arsenic. Four of the donor atom's electrons bind covalently with the semiconducting material while the fifth electron is free to move into the conduction band if the diode receives the appropriate amount of energy. The amount of energy required to move electrons into the conduction band is the band gap energy. The band gap of a standard silicon diode is 1.1 electron volts, and the band gap of a red diode is about 1.4 electron volts. The band gap of the gallium-nitride, light-emitting diodes in LED device 30, however, is much higher. Gallium-nitride LED dies that emit blue light at about 452 nanometers have a band gap of 2.7-2.8 electron volts.

The voltage across a diode through which a constant current is flowing varies with temperature according to the relationship $V=C-T/B$, where C is indicative of the constant current, and B is indicative of the band gap energy of the diode. For a constant current of 5 mA, C equals 2.5873. For a gallium-nitride diode that emits light at 452 nanometers, B equals 769.231. Thus, the temperature-voltage relationship shown in FIG. 4 can be expressed as $V=2.5873-T/769.231$. Using the voltage V across sensor LED die 11 as an input, the control circuitry calculates the temperature of LED die 11 using the formula $T=769.231\times(2.5873-V)$ for a constant current of 5 mA flowing through LED die 11. The calibration factor C must be adjusted when a different constant bias current is used.

Using a smaller constant bias current has the advantage that less heat is produced as current flows through sensor die 11. Any heat produced by the bias current results in a higher temperature around sensor die 11 that around the other LED dies. In addition, some 452-nm light is generated even by a small bias current. The blue light emitted by sensor LED die 11 even with a small bias current results in a color over position inhomogeneity of the overall light emitted from LED device 30 and should be minimized. However, a smaller constant bias current also results in a lower signal-to-noise ratio of the voltage detection signal from sensor die 11. A good compromise between reducing heat and color inhomogeneity and reducing noise in the temperature signal is a constant bias current of between 0.1 mA and 1 mA.

Silicon diodes and red diodes would be unsuitable for sensing the temperature inside silicone layer 33 because these diodes would absorb the longer wavelength light emitted by the phosphor particles 34 and would produce a current. Just as light-emitting diodes produce light when a current is passed through the diodes, the diodes produce a current when light with the appropriate amount of energy (the band gap energy) is absorbed by the diodes. The current produced when light with a band gap energy of 1.1 or 1.4 eV for silicon or red diodes is absorbed would add to the constant bias current, would effect the voltage detection signal and would thus interfere with the temperature measurement. On the other hand, white light and the light emitted by the phosphor particles 34 does not have sufficient energy to bridge the band gap of the gallium-nitride, light-emitting diodes of LED device 30. Whereas diodes with a band gap energy of 1.1 or 1.4 eV would absorb almost 100% of the light emitted by LED dies 14-19, gallium-nitride LED die 11 with a band gap energy of 2.7-2.8 eV absorbs only a fraction of 1% of the light that strikes it within LED device 30.

The low light absorption of gallium-nitride LED dies compared to silicon or red diodes has another advantage besides not interfering with the temperature measurement. The low light absorption of gallium-nitride LED dies allows one of the dies to be used to sense temperature within the silicone layer 33 without decreasing the lumen output of LED device 30. Because a silicon or red diode would absorb almost 100% of the generated light that strikes it, such a diode would have to be covered by a reflective material to prevent absorption. The sapphire substrate of LED die 11, however, is substantially transparent to the white light. Placing a gallium-nitride LED die under silicone layer 33 and using the die to sense temperature will not create a dark spot on LED device 30.

Other advantages of using a gallium-nitride LED die instead of a silicon or red die to sense temperature under silicone layer 33 are cost and performance. Using diodes in LED device 30 that are all of the same type is less expensive than sourcing and placing a second type of diode next to the LED dies on substrate 12. The cost of placing an additional LED die on substrate 12 to be used to sense temperature is minimal because the same processes and equipment is used. The performance of LED die 11 that is used as a temperature sensor is also superior to that of a silicon or red diode. The LED die 11 will last as long as the other LED dies on LED device 30 that are of the same type. Moreover, the LED dies have been designed and tested to last for 50,000 hours and to resist spikes in temperature of up to 200° C.

Figure 5:
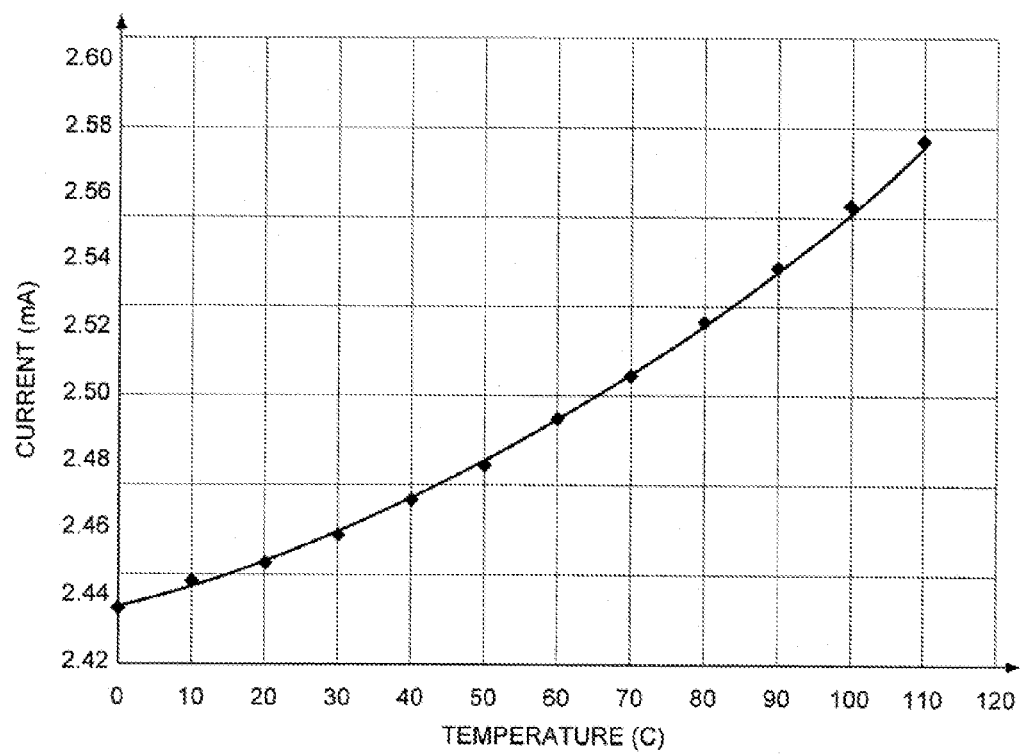
FIG. 5 is a graph of the temperature-current relationship of a gallium-nitride diode under a constant voltage of 2.6 volts.

FIG. 5 is a graph of the temperature-current relationship of a GaN diode under a constant voltage. The temperature of LED die 11 can also be determined by monitoring the current through LED die 11 while the voltage across LED die 11 is maintained constant. The curve of FIG. 5 shows how the current flowing through LED die 11 varies with the temperature of LED die 11 as a constant voltage of 2.6 volts is maintained across LED die 11. However, this method is not preferred over sensing the voltage with constant current because the current flowing through a diode with a constant voltage does not vary linearly with temperature. Consequently, each sensor LED die would have to be calibrated to determine the best-fitting curve through the calibration points. For the particular GaN LED die that generated the calibration points of FIG. 5, an approximate relationship between temperature and current for a constant voltage of 2.6V across the diode can be expressed as $I=7.3794e^{0.02T}$. The non-linear relationship of temperature to current also requires a more complex control circuitry to calculate than does the linear relationship of temperature to voltage.

Figure 6:
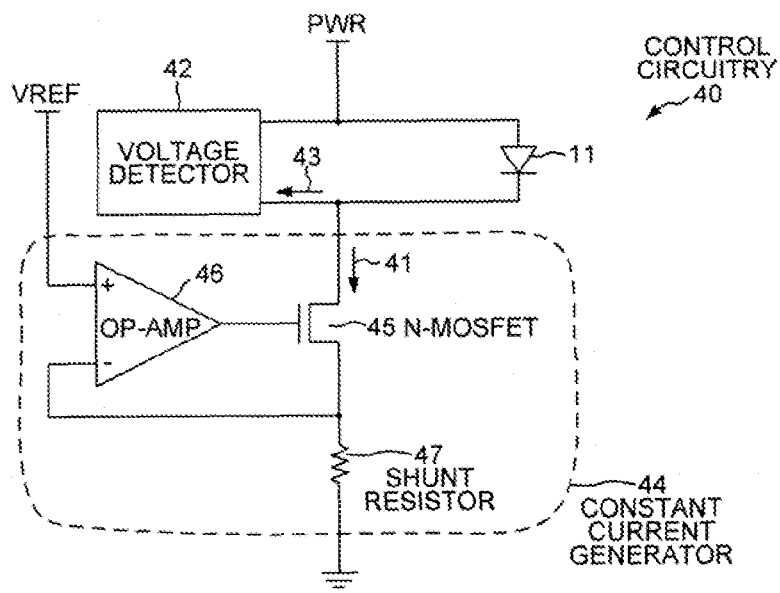
FIG. 6 is a simplified schematic block diagram of control circuitry that supplies a sensor LED die with a constant current and that determines a voltage across the LED die.

FIG. 6 is a simplified schematic block diagram of control circuitry 40 that supplies sensor LED die 11 with a constant current 41 and that determines a voltage across LED die 11. Control circuitry 40 includes a voltage detector 42 that determines the voltage across LED die 11 using a voltage detection signal 43. Voltage detector 42 includes a differential amplifier, a band pass filter, an analog-to-digital converter and a microcontroller to read out the voltage value. Control circuitry 40 generates a constant current using constant current generator 44. Constant current generator 44 includes an N MOSFET 45, an operational amplifier 46 and a shunt resistor 47. In one embodiment, constant current generator 44 sinks a constant 1 mA current 41 through LED die 11. The 1 mA current 41 is monitored by operational amplifier 46 using resistor 47. Operational amplifier 46 compares the voltage across resistor 47 to a reference voltage and opens transistor 45 to the extent required to maintain the voltage across resistor 47 at the reference voltage. The current flowing through transistor 45 that is required to maintain the voltage across resistor 47 at the reference voltage is the 1 mA current 41.

Figure 7:
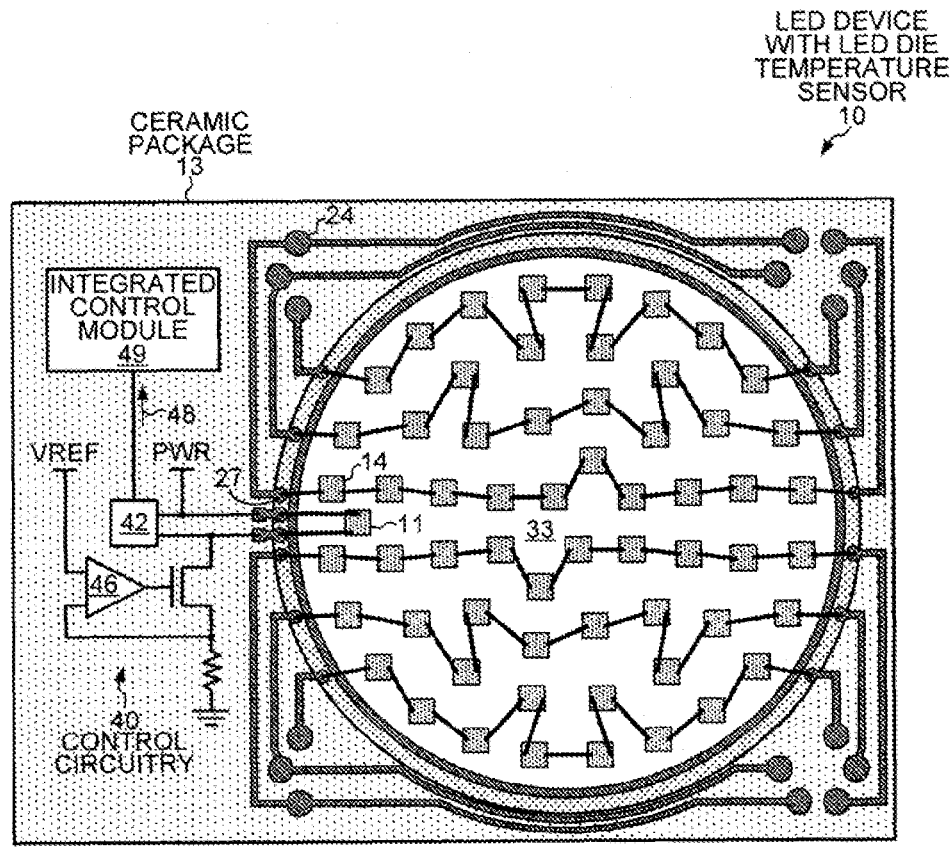
FIG. 7 shows an embodiment of the device of FIG. 1 in which the control circuitry of FIG. 6 has been incorporated into the ceramic package.

FIG. 7 shows an embodiment of LED device 10 in which the control circuitry 40 of FIG. 6 has been incorporated into ceramic package 13. LED device 10 includes a first LED die 14 and a second LED die 11 which both have the same structure. Both dies 11 and 14 are covered by transparent carrier material 33 that encapsulates the dies. First LED die 14 is used to emit blue light, and second LED die 11 is used as a thermocouple to sense temperature. An LED drive current with a magnitude sufficient to illuminate the first LED die 14 is supplied to the first LED die 14 through landing pad 27 of positive supply terminal 24. Landing pad 27 and supply terminal 24 are part of the driver circuitry that supplies the first LED die 14 with the drive current. The driver circuitry includes a driver that is not incorporated into ceramic package 13. Control circuitry 40 supplies the second LED die 11 with a constant current and determines the voltage across the second LED die 11.

LED device 10 can be used to illuminate first diode 14 by supplying a drive current to first diode 14. At the same time, LED device 10 with control circuitry 40 is used to supply second diode 11 with a constant current whose maximum magnitude never exceeds ten milliamps and to determine the temperature of second diode 11 based on the voltage across second diode 11. The temperature of both first diode 14 and second diode 11 is the same because both are encapsulated by silicone layer 33 with suspended phosphor particles 34. In one implementation, the maximum magnitude of the constant current flowing through second diode 11 is five milliamp. The control circuitry calculates the temperature in degrees Celsius of second diode 11 based on the voltage across second diode 11 using the formula T=769.231×(2.5873−V). The voltage detector 42 of control circuitry 40 outputs a temperature signal 48 that provides a real-time indication of the temperature of the LED dies in LED device 10. Temperature signal 48 is provided to an integrated control module 49 that can take action in the event that the temperature of the LED dies exceeds a predetermined threshold. For example, the integrated control module can reduce the drive current to the LED dies to reduce the temperature within the silicone layer 33. Or the integrate control module can send a message via a wireless interface indicating that LED device 10 has exceeded the predetermined threshold for a measured amount of time.

Figure 8:
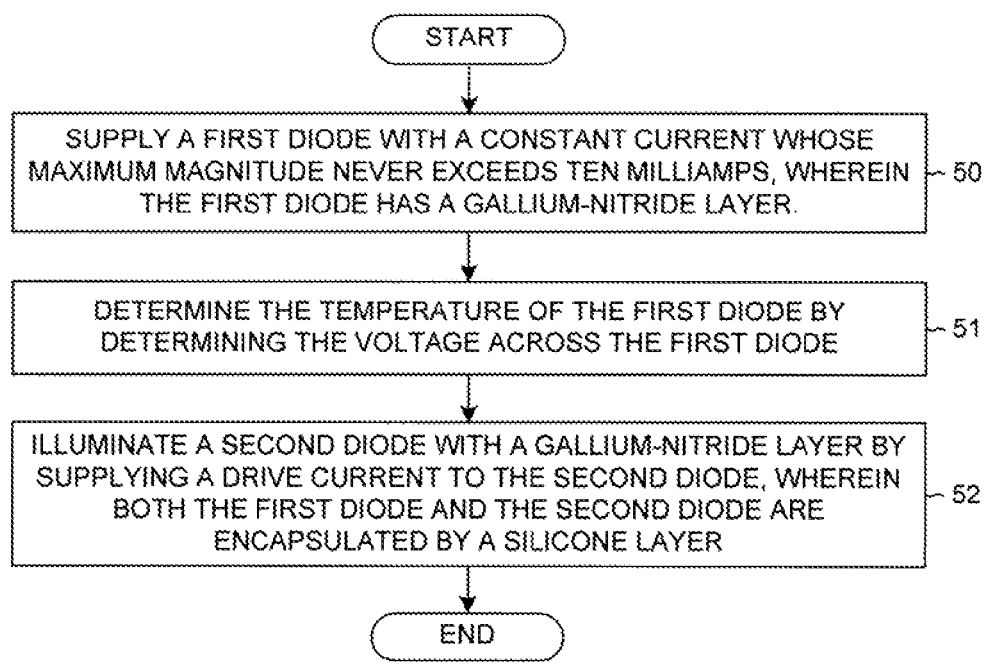
FIG. 8 is a flowchart illustrating a method for determining the temperature of an LED die of an array of LED dies covered by a silicone layer.

FIG. 8 is a flowchart illustrating steps 50-52 of a method for determining the temperature of an LED die of an array of LED dies covered by a silicone layer. In a step 50, a first LED die with a gallium-nitride layer is supplied with a small constant bias current. All of the LED dies of the array have the same semiconductor structure as the first LED die. In one implementation, the maximum magnitude of the constant bias current never exceeds ten milliamps. In step 51, the temperature of the first LED die is calculated by determining the voltage across the first LED die. In step 52, a second LED die with a gallium-nitride layer is illuminated by supplying the second LED die with a drive current. Both the first LED die and the second LED die are encapsulated by a silicone layer. The method involves measuring a voltage drop across a single LED die that is covered by a silicone layer along with other LED dies of the same structure.

Although certain specific embodiments are described above for instructional purposes, the teachings of this patent document have general applicability and are not limited to the specific embodiments described above. Although the sensor LED die 11 is described above as being a GaN diode that emits light at 452 nanometers, an LED that emits light at other wavelengths can also be used to sense the temperature under the silicone layer 33. For example, a GaInN diode or a diode that does not contain gallium can be used. But the value for B in the formula V=C−T/B must correspond to the band gap energy of the other diode instead of that of the 452-nm GaN LED. Accordingly, various modifications, adaptations, and combinations of various features of the described embodiments can be practiced without departing from the scope of the invention as set forth in the claims.

What is claimed is:

1. A device comprising:
 a first light emitting diode (LED) die;
 a second LED die, wherein the first LED die and the second LED die have the same structure;
 a transparent carrier material that encapsulates both the first LED die and the second LED die;
 driver circuitry that supplies the first LED die with sufficient drive current to illuminate the first LED die;
 a power supply terminal through which an LED drive current is supplied to the first LED die, wherein the LED drive current has a magnitude sufficient to illuminate the first LED die; and
 control circuitry that supplies the second LED die with a constant current and that determines a voltage across the second LED die.

2. The device of claim 1, wherein the drive current has a maximum magnitude, and wherein the constant current has a maximum magnitude that never exceeds the maximum magnitude of the drive current.

3. The device of claim 1, wherein the current supplied to the second LED die never exceeds ten milliamps.

4. The device of claim 1, wherein the control circuitry determines a temperature of the second LED die based on the voltage across the second LED die.

5. The device of claim 1, wherein phosphor particles are suspended in the transparent carrier material.

6. The device of claim 1, wherein the transparent carrier material is silicone.

7. The device of claim 1, wherein each of the first LED die and the second LED die has a gallium nitride (GaN) layer.

8. The device of claim 1, wherein the second LED die has a band gap that exceeds two electron volts.

9. A device comprising:
 a first light emitting diode (LED) die;
 a second LED die, wherein the first LED die and the second LED die both include the same semiconductor layers;
 a silicone layer that encapsulates both the first LED die and the second LED die;

a power supply terminal through which an LED drive current is supplied to the first LED die, wherein the LED drive current has a maximum magnitude that exceeds ten milliamps; and control circuitry that supplies the second LED die with a current that never exceeds ten milliamps.

10. The device of claim 9, wherein the control circuitry determines a voltage across the second LED die.

11. The device of claim 10, wherein the control circuitry determines a temperature of the second LED die based on the voltage across the second LED die.

12. The device of claim 9, wherein the silicone layer comprises phosphor particles suspended in silicone.

* * * * *